United States Patent [19]

Solie et al.

[11] 4,206,426

[45] Jun. 3, 1980

[54] MULTIPLE POLE SURFACE WAVE ACOUSTIC FILTERS EMPLOYING ANGLED GROOVED DISTRIBUTED REFLECTOR ARRAYS

[75] Inventors: Leland P. Solie, Acton; William J. Tanski, Maynard, both of Mass.

[73] Assignee: Sperry Corporation, New York, N.Y.

[21] Appl. No.: 964,763

[22] Filed: Nov. 29, 1978

[51] Int. Cl.[2] .......... H03H 9/02; H03H 9/26; H03H 9/32; H01L 41/10

[52] U.S. Cl. .......... 333/195; 333/153; 333/196

[58] Field of Search .......... 333/193-196, 333/150-155; 330/5.5; 310/313; 331/107 A

[56] References Cited

U.S. PATENT DOCUMENTS

| | | | |
|---|---|---|---|
| 4,013,983 | 3/1977 | Hartemann | 310/313 X |
| 4,054,851 | 10/1977 | Borner et al. | 333/195 |
| 4,065,735 | 12/1977 | Palfreeman et al. | 333/196 X |
| 4,114,119 | 9/1978 | Sandy et al. | 333/196 X |

OTHER PUBLICATIONS

Hartemann—"Ion-Implanted Acoustic-Surface-Wave Resonator" in Applied Physics Letters, vol. 28, No. 2, Jan. 15, 1976, pp. 73-75.

Williamson—"Properties and Applications of Reflective-Array Devices" in Proceedings of the IEEE, vol. 64, No. 5, May 1976, pp. 702-710.

Cross et al.—"Design and Applications of Two-Port Saw Resonators on YZ-Lithiumniobate" in Proc. of the IEEE, vol. 64, No. 5, May 1976, pp. 682-685.

Tuan et al.—"Theory for Saw Grooved Reflector Arrays" in IEEE Trans. on Sonics and Ultrasonics, vol. SU-24, No. 6, Nov. 1977, pp. 384-392.

*Primary Examiner*—Alfred E. Smith
*Assistant Examiner*—Marvin Nussbaum
*Attorney, Agent, or Firm*—Howard P. Terry

[57] ABSTRACT

A multiple track acoustic surface wave filter processes input signals successively flowing in coupled resonant acoustic tracks, each track being realized between pairs of surface wave reflectors in the surface of a planar piezoelectric substrate.

16 Claims, 9 Drawing Figures

60 A B 60a 70 70a 61 C 61a 64 64a 31 31a 66 66a 67 30

FIG. 7.
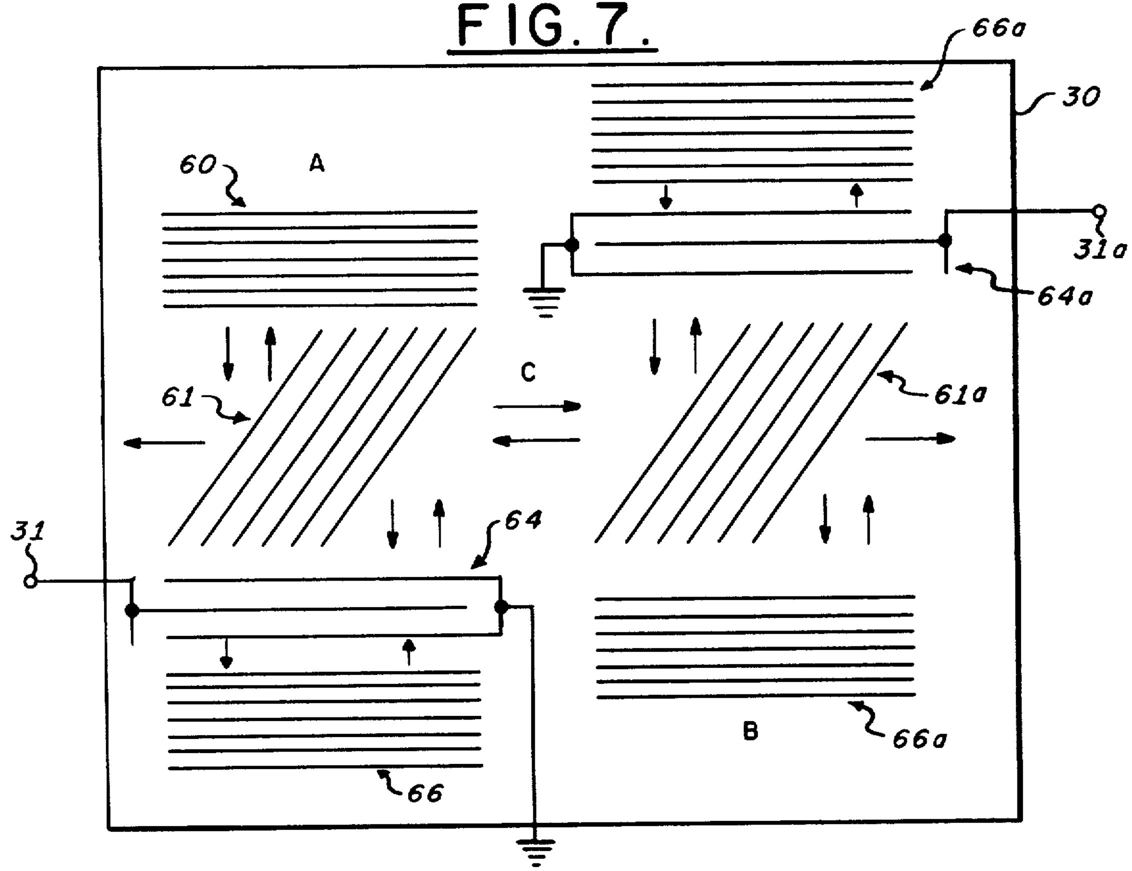
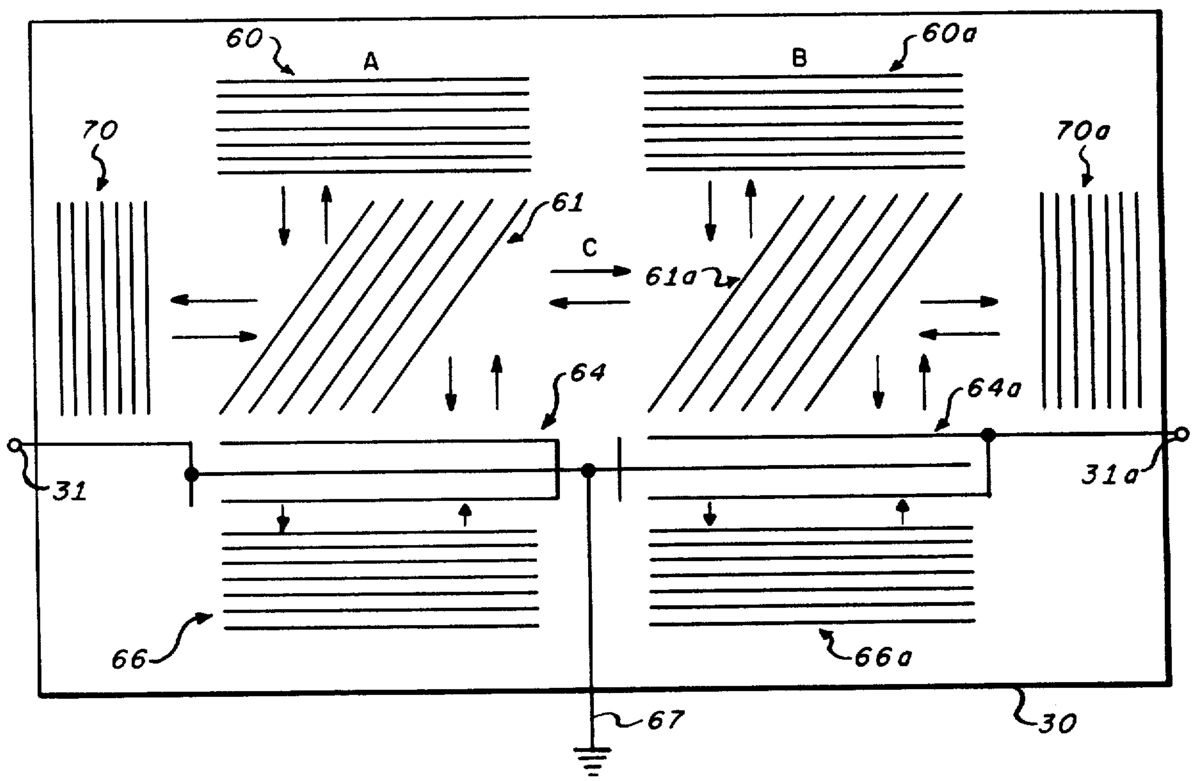
FIG. 8.

MULTIPLE POLE SURFACE WAVE ACOUSTIC FILTERS EMPLOYING ANGLED GROOVED DISTRIBUTED REFLECTOR ARRAYS

BACKGROUND OF THE INVENTION

1. Field of the Invention

The present invention relates generally to acoustic surface wave signal processors employing interacting acoustical means for processing electrical input signals and yielding modified electrical output signals and, more particularly, concerns multiple track acoustic surface wave filters in which a portion of the acoustic energy in adjacent resonant systems is transferred back and forth to form a coupled resonant system.

2. Description of the Prior Art

Prior art single pole acoustic wave filter devices have been realized in several forms, as will be further described in the present specification. A fully satisfactory way of extending these prior techniques to the generation of multi-pole acoustic wave filter devices has not previously been achieved for low coupling substrates, but will be supplied according to the present invention.

SUMMARY OF THE INVENTION

Preferred embodiments of the present invention are constructed by forming a network of interconnected acoustic transmission lines having substantially parallel tracks on a surface wave substrate, each track being realized between pairs of distributed surface wave reflectors on the surface of a planar piezoelectric element. Standing waves are excited at or are removed from the network by interdigital electrode devices. Standing waves are coupled between the various resonant tracks by distributed angle arrays of reflector elements and are otherwise confined with the tracks by other reflector arrays.

BRIEF DESCRIPTION OF THE DRAWINGS

FIGS. 6 through 9 are plan views of dual port, multiple pole surface wave acoustic filters according to the present invention.

DESCRIPTION OF THE PREFERRED EMBODIMENTS

Figure 1:
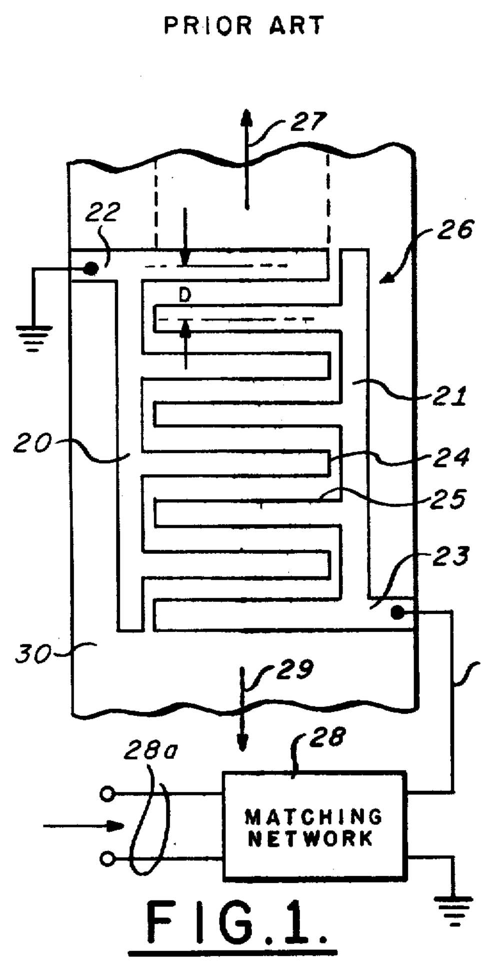
FIG. 1 is a plan view of a prior art acoustic wave launching or acoustic wave receiving device.

Multi-pole, multi-port surface wave acoustic filters according to the present invention are constructed by forming resonant acoustic transmission lines between pairs of surface wave reflectors on the surface of a piezoelectric medium. The standing waves may be excited by a conventional surface acoustic wave exciting or wave launching transducer device kindred to that illustrated in FIG. 1. Removal of the surface acoustic wave from the filter for generating a new electrical wave may be accomplished by similar transducer structures, since the reciprocity theorem applies. While several types of surface acoustic wave exciter and receiver transducers are available in the prior art, one preferred form of the surface wave excitation means is illustrated in FIG. 1 in which the device 26 consists of a pair of electrodes 20, 21 with respective interdigital electrode fingers or alternating instantaneous electrical polarity, such as the respective fingers 24, 25. Standard photo-etching and photoresist masking or other known techniques may be used to fabricate the thin conductors of the interdigital electrodes 20, 21 on substrate 30, which electrodes may be made of aluminum or of other electrically conducting material, and may have widths of the order of microns. The device 26 may be formed as a thin overlay on the surface of substrate 30, or may be inlayed flush with the surface of substrate 30, as will be further discussed in connection with FIGS. 2 and 3. Adjacent electrode fingers of any one electrode, such as fingers 24 of electrode 20, are spaced substantially one wave length apart at the center of the operating carrier frequency range. The electrode device 20, 21 may act generally as an end fire array, propagating a desired forward surface acoustic wave in the direction indicated by arrow 27 when driven by signals which may be passed through a conventional matching network 28 and lead 31 from a signal source (not shown) coupled to leads 28*a*. Since the reciprocity theorem evidently applies to the exciter of FIG. 1, a similarly constructed electrode system may act as a surface acoustic wave receiver, coupling to the traveling electric field associated with the flowing surface elastic wave, and thereby yielding a useful electrical output on lead 31 for signal processing.

In operation, the exciter electrode system 26 of the transducer of FIG. 1, for example, interacts with the quartz or other piezoelectric substrate 30, and may produce two oppositely running surface acoustic waves 27, 29 flowing at right angles to the electrode fingers 24, 25. Adjacent fingers of electrodes 20, 21 are preferably spaced apart by an integral number of half wave lengths. The traveling wave is successively increased as it passes under each pair of electrode fingers. A receiver electrode system is similarly constituted and operates in the reverse sense to reconvert the acoustic wave into a somewhat delayed electrical output signal. In both cases, it is preferred in the interest of efficiency to space the electrode fingers so that the condition of acoustic synchronism obtains, the traveling electric field at the exciter, for example, having the same periodicity as the electric field normally bound to the acoustic wave. For this condition, D in FIG. 1 is one half wave length.

Figure 2:
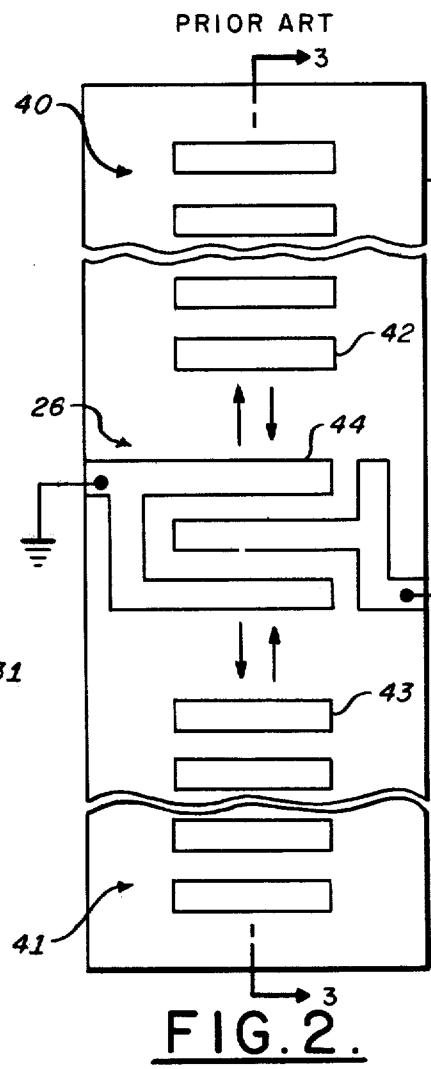
FIG. 2 is a plan view of a prior art single port, single pole surface wave acoustic resonator.
Figure 3:
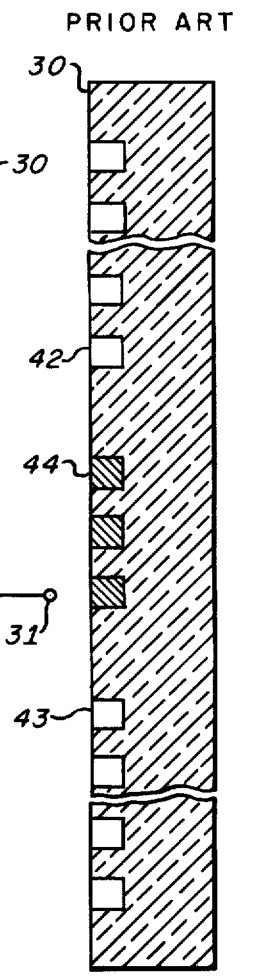
FIG. 3 is a cross section view taken along the line 3—3 of FIG. 2.
Figure 4:
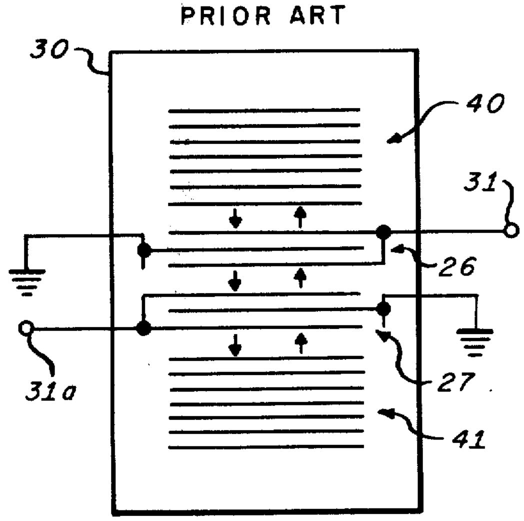
FIG. 4 is a plan view of a prior art dual port, single pole surface wave acoustic resonator device.

Single and dual port, single pole surface wave resonators have been discussed extensively in the prior art; for example, such narrow-band resonators or filters as are shown in FIGS. 2 through 4 were discussed by P. S. Cross et al, "Design and Applications of Two-Port SAW Resonators on YZ-Lithium Niobate", *Proceedings of the I.E.E.E.,* Vol. 64, No. 5, pages 682 to 685, May 1976. In FIG. 2, such a resonator is defined by pairs 40, 41 of reflector arrays, between which pairs the traveling surface acoustic waves are normally launched in both directions by the central transducer 26. In the cross-section view of FIG. 3, the FIG. 2 filter is shown as comprising a transducer 26 having inlayed interdigital metal, electrically conducting fingers, such as electrode finger 44, disposed between the substantially total reflection arrays 40, 41. With the grooves 44 filled with aluminum flush with the surface of a quartz substrate 30, the launching (or receiving) electrode is nearly non-reflecting with respect to the acoustic wave, as is desirable. Each distributed reflector grating array 40, 41 may consist of a regular parallel plurality of lineal impedance discontinuities, such as grooves 42, 43, metal strips, or ion implanted lines. The grooves are disposed perpendicular to the surface wave propagation paths, the grooves being formed, for example, by a known ion beam or other etching process. Other than strictly rectangular grooves may be employed. As described by P. S. Cross et al, by Hangsheng Tuan et al, "Theory for SAW Grooved Reflector Arrays", *I.E.E.E. Transactions on Sonics and Ultrasonics*, Vol. SU-24, No. 6, pages 384 to 392, November 1977, and elsewhere, the frequency band and reflectivity of the distributed reflecting array of grooves is determined by such parameters as the spacing between groove centers and the number and the depth of the grooves. For example, by experimentally varying the individual depths and the number of the grooves in the array, the effective reflectivities of the distributed arrays 40, 41 can be varied arbitrarily from less than one percent of the incident acoustic energy to effectively a totally reflecting one hundred percent.

As in the prior art, a filter may have a single port, as illustrated in FIGS. 2 and 3, where the transducer 26 is coupled via lead 31 to associated apparatus 28, and where transducer 26 is shown, merely for the sake of simplicity, as having only three interleaved electrode fingers 44, whereas it will normally have a larger number of such fingers.

Prior art dual port, single pole filters may take the form shown in FIG. 4 wherein a pair of side-by-side transducers 26, 27 is disposed between the resonator-defining total reflector arrays 40, 41, transducer 26 being supplied with an input at terminal 31 and transducer 27 having an output at terminal 31a.

Figure 5:
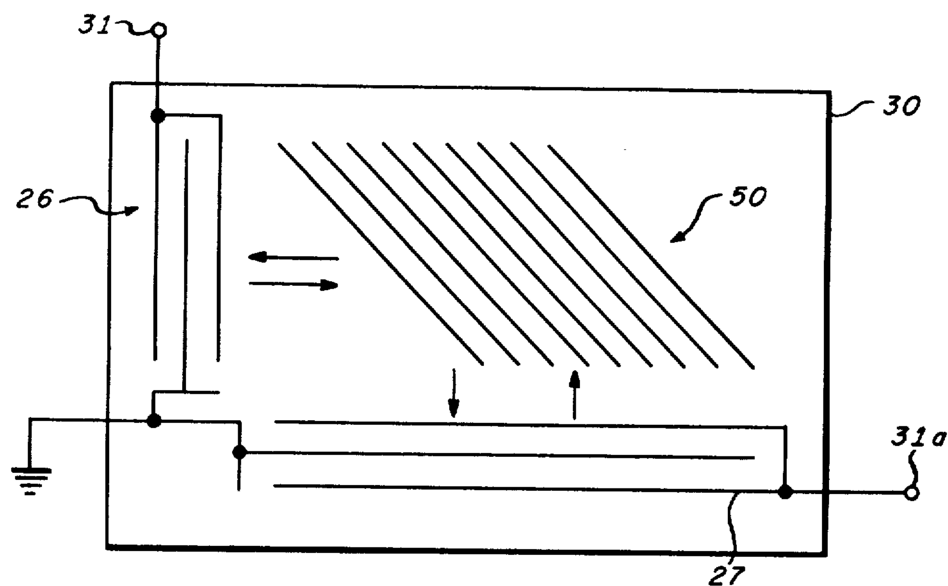
FIG. 5 is a plan view of a conventional filter device.

In the prior art, dual port transducers have also been constructed as in FIG. 5. This arrangement requires at least one distributed grating grooved array 50 disposed on a substrate 30 at about a 45° angle so as to redirect the flow of the surface wave within the filter itself, not directing any energy out of that device. For this purpose, an input transducer 26 supplies an acoustic wave front that impinges upon the angled groove reflector array 50 which, in turn, redirects substantially all of the wave energy toward an output transducer 27 oriented at right angles to input transducer 26. A second substantially totally reflective grating array has been used in some cases to redirect the path of the acoustic wave from grating array 50 so that it is parallel to the impinging path for collection by an output transducer disposed parallel to input transducer 26, both of the angled arrays being disposed within the filter itself, not directing energy out of that device.

As noted by R. C. Williamson, "Properties and Applications of Reflective-Array Devices", *Proceedings of the I.E.E.E.*, Vol. 64, No. 5, May 1976, pages 702 to 710, attempts made to use the FIG. 5 scheme in efforts to generate multi-pole or band pass filters have not been notably successful. In general, these and other prior art devices herein discussed provide in themselves useful single and double port, single pole resonators, but when considered for applications in multiple pole filters one or more difficulties appear. Where the input and output transducers are in line, out-of-band rejection is poor. Again, the input and output transducers are generally physically close, so that direct signal leakage is undesirably enhanced. It has not proved readily possible to construct acceptable pass band filters where the pass band is acceptably flat and the band characteristic skirts are desirably steep. None of the prior art techniques has been particularly suited for use with inexpensive low piezoelectric coupling materials, such as ST-cut alpha quartz, essentially a necessity in avoiding temperature sensitivity.

Figure 6:
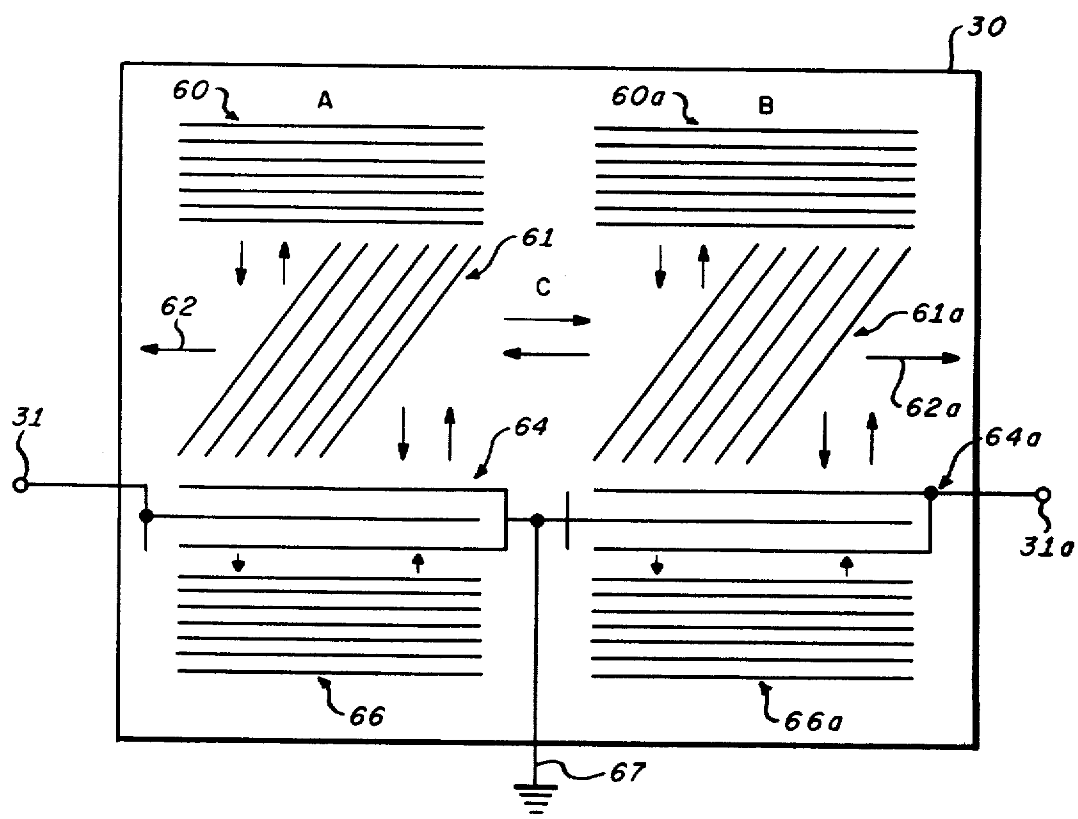

In accordance with one embodiment of the present invention, FIG. 6 makes use of multiply coupled surface acoustic wave tracks or paths A, B, and C to achieve the desired multi-pole filter structure. As is seen in FIG. 6, the device employs an input transducer 64 fed from terminal 31. Any acoustic energy flowing from transducer 64 in path A toward the distributed grating reflector array 66 is totally reflected through the transversely angled reflector array 61 and flows along with the wave flowing directly from input transducer 64. Opposite the transversely angled array 61 and also perpendicular to path A is a total reflector distributed array 60 similar to array 66. In a second acoustic path B generally parallel to and spaced from the path A in which transducer 64 is disposed, is a second similar arrangement of elements involving first and second parallel total reflector arrays 60a, 66a, with an output transducer 64a and a transversely angled array 61a disposed between the reflector arrays 60a, 66a. These sets of elements in paths A and B cooperate to form parallel acoustic energy paths or tracks with wave fronts parallel to transducers 64, 64a and a third acoustic energy path C perpendicular to the first two paths, as indicated in the figure by the several arrows. Furthermore, the first two parallel paths A and B form two resonators between their associated distributed total reflectors 60, 66, 60a, 66a and acoustic energy is therefore transferred between the two resonators along path C through the agencies of the two angled transverse grooved reflector arrays 61, 61a. Because the acoustic energy must be reflected twice by angled transverse reflectors 61, 61a to pass along path C from the input resonator to the output resonator, a relatively high reflectivity is required for the transverse reflectors 61, 61a so that critical coupling and multi-pole operation of the filter is achieved. It is readily apparent that the angled array 61 of FIG. 6 directs maximum energy toward array 61a and also performs significant roles not performed by the similar array 50 of FIG. 5. It will, of course, be understood that various kinds of reflector elements may be used in constructing reflectors 60, 60a, 66, 66a, as previously described.

While the arrangement of FIG. 6 overcomes certain of the defects of the prior art and makes readily possible the design of useful dual port, multi-pole acoustic filters, it may be further improved as is demonstrated in FIGS. 7 and 8. In FIG. 6, it is evident that the input transducers 64, 64a are in close proximity, thus permitting, in some applications, undesired coupling and by-passing of energy between transducers 64, 64a. This effect may be beneficially removed as in FIG. 7 by placing the output transducer 64a in diagonally opposite relation on substrate 30 with respect to the input transducer 64. Corresponding parts bear corresponding reference numerals as in FIG. 6.

In FIG. 8, corresponding parts appearing in FIGS. 6 and 7 again bear the same reference numerals and a further improvement over the apparatus of FIG. 6 is disclosed. In FIG. 6, the arrows 62, 62a indicate that a substantial amount of the acoustic energy is simply lost in opposite directions out of opposed sides of the planar filter structure. It is seen that the surface waves in tracks A and B are reflected into the transverse path C and only a part of the energy is reflected back into a second resonator, resulting in a significant energy loss. As shown in the further improvement of FIG. 8, the energy that would be lost in this manner is, according to one aspect of the invention, returned to the filter system by the addition of opposed distributed grooved reflector arrays 70, 70*a*, one each at each end of track C. By deliberately making the reflectivities of arrays 70, 70*a* high, a third resonator is thereby coupled to the first two resonators, so that the filter system may consist of three coupled resonators with three spaced resonant peaks, further beneficially widening and sharpening the effective filter pass band. On the other hand, the reflectivities of arrays 70, 70*a* may be arbitrarily reduced so that the pass band is that of a dual resonator system with desirably reduced insertion loss. The latter arrangement is of interest as a filter system lacking a resonance in the transverse path C with inherent velocity and temperature delay characteristics differing from those of paths A and B. Coupling along path C may be varied beneficially by variation of the density of the grooves or elements in reflectors 61, 61*a* at right angles to the direction of path C. In other words, the number of grooves per unit length in the direction normal to the path C axis will be appropriately adjusted. For example, the density variation or weighting function may approximate a cosine amplitude distribution in order to select the desired acoustic mode for transmission of energy between the resonators of paths A and B. It will be apparent to those skilled in the art that the path C third resonator of FIG. 8 may equally well be employed in the arrangement of FIG. 7.

Figure 9:
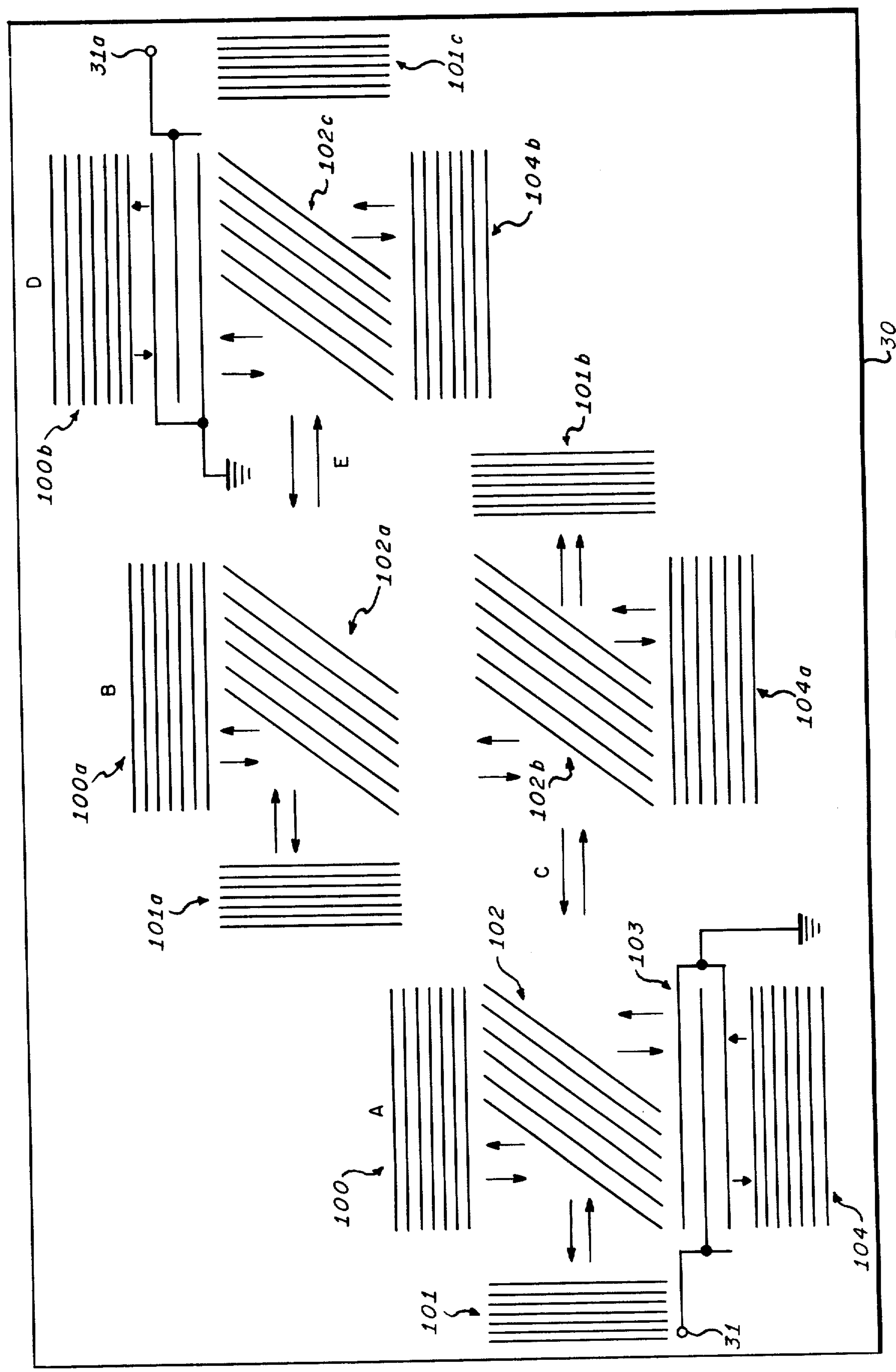

While the generation of two and three pole filters according to the invention has been described, the invention is not limited even to triple pole devices and may be used, in general, equally well to form other multiple resonator configurations, as is shown in the further example of FIG. 9. By coupling a plurality of resonators according to the figure, it is readily possible to realize multiple pole responses with essentially flat pass bands, steep skirts, and significantly high out-of-band signal rejection. In general, the configuration of FIG. 9 has, disposed upon a substrate 30, a first or input resonant track A, a first transverse transfer track C which may be resonant, a first transfer track B parallel to input track A, a second transverse track E which may also be resonant, and a final or output resonant track D. It will be apparent that further such resonant circuits may be included by making series or parallel track configurations in which, for example, additional tracks like track B are employed, or wherein tracks such as track B may include more than two angle grating arrays and thus cooperate in more than two resonant transverse paths.

In FIG. 9, an input track A similar to track A of FIG. 7 is employed along with an output track D similar to output track B of FIG. 7. For example, input track A employs a pair of total reflectors 100, 104 spaced apart to accommodate input transducer 103 and the angled reflector array 102. Similarly, output track D employs a pair of total reflectors 100*b*, 104*b* spaced apart to accommodate output transducer 103*a* and the angled reflector assembly 102*c*. Parallel to and disposed between tracks A and D is an intermediate track B wherein the angled arrays 102*a* and 102*b* form a track B for coupling track C to track E. Track B employs a pair of angled arrays 102*a*, 102*c* disposed between total reflectors 100*a*, 104*a*. The elements between end reflector arrays 101 and 101*b*, 104*a* and 100*a*, and 101*a* and 101*c* may be adjusted arbitrarily, as in the foregoing filter structures, to form resonators peaked at selected frequencies for forming a wide variety of desired multi-pole pass band filters.

Accordingly, it is seen that the invention provides versatile techniques for forming surface wave resonators on temperature stable media aiding the construction of multi-pole filters with improved frequency responses, including filters with flat pass bands, steep skirts, high out-of-band signal rejection, and minimum insertion loss. The invention advantageously disposes the input and output transducers in different tracks so that they enjoy material physical separation. The invention beneficially employs coupling elements between resonant tracks, which coupling elements may also be adjusted to contribute to the desired multiple pole characteristics of the filter. The couplings between the several resonators may readily be varied by simple design techniques over wide ranges. For example, the transverse coupling path resonator characteristics may be superimposed upon the resonant characteristics of the primary resonators so as to minimize the sizes of the resonators, thus suppressing undesired additional resonant modes. Construction is facilitated because the same mask and the same etching process may be used in forming all reflectors and in etching grooves in which the transducer electrodes are subsequently formed. It will be readily recognized that the novel devices perform equally well with inputs and outputs interchanged.

While the invention has been described in its preferred embodiments, it is understood that the words which have been used are words of description rather than of limitation and that changes within the purview of the appended claims may be made without departure from the true scope and spirit of the invention in its broader aspects.

What is claimed is:

1. Signal processing apparatus comprising:

substrate means for propagating acoustic waves at a surface thereof, first transducer means for launching an acoustic wave along a first propagation track at said surface, first and second spaced apart reflector means disposed at opposed ends of said first propagation track for defining first resonator means, second transducer means for receiving an acoustic wave along a second propagation track at said surface, third and fourth spaced apart reflector means disposed at opposed ends of said second propagation track for defining second resonator means, fifth and sixth reflector means respectively cooperating with said first and second resonator means for forming a third propagation track along said surface intersecting said first and second propagation tracks whereby acoustic wave energy is coupled between said first, second, and third propagation tracks, and seventh and eighth spaced apart reflector means at opposed ends of said third propagation track for defining third resonator means.

2. Apparatus as described in claim 1 wherein said first and second spaced apart reflector means each comprise periodically disposed parallel grooves oriented substantially at right angles to said first propagation path within said substrate means surface.

3. Apparatus as described in claim 2 wherein said third and fourth spaced apart reflector means each comprise periodically disposed parallel grooves oriented substantially at right angles to said second propagation path.

4. Apparatus as described in claim 3 wherein said fifth reflector means comprises periodically disposed parallel grooves oriented with respect to said first propagation track such as to reflect substantial acoustic energy toward said sixth reflector means along said third propagation track.

5. Apparatus as described in claim 4 wherein said sixth reflector means comprises periodically disposed parallel grooves oriented with respect to said second and third propagation tracks so as to transfer significant acoustic wave energy therebetween.

6. Apparatus as described in claim 5 wherein said first and second transducer means comprise interdigital electrode means, the cooperating interdigital fingers thereof being disposed substantially perpendicular to said respective first and second propagation tracks.

7. Apparatus as described in claim 6 wherein said cooperating interdigital fingers are aluminum and said fingers are inlayed within said substrate substantially flush with said surface thereof.

8. Signal processing apparatus comprising:
- substrate means for propagating acoustic waves at a surface thereof,
- first transducer means for launching an acoustic wave along a first propagation track at said surface,
- first and second spaced apart reflector means disposed at opposed ends of said first propagation track for defining first resonator means,
- second transducer means for receiving an acoustic wave along a second propagation track at said surface,
- third and fourth spaced apart reflector means disposed at opposed ends of said second propagation track for defining second resonator means, and
- fifth and sixth reflector means respectively cooperating with said first and second resonator means for forming a third propagation track along said surface intersecting said first and second propagation tracks whereby acoustic wave energy is coupled between said first, second, and third propagation tracks,
- wherein said third propagation track includes seventh and eighth reflector means respectively coupled to said fifth and sixth reflector means for forming therebetween a fourth propagation track substantially perpendicular to said first and second propagation tracks.

9. Apparatus as described in claim 8 additionally including ninth and tenth spaced apart reflector means at opposed ends of said fourth propagation track for defining third resonator means.

10. Apparatus as described in claim 9 wherein said fifth and seventh reflector means are so disposed as to coupled acoustic energy between said first and fourth propagation tracks for forming fourth resonator means.

11. Apparatus as described in claim 10 wherein said sixth and eighth reflector means are so disposed as to couple acoustic energy between said fourth and second propagation tracks for forming fifth resonator means.

12. Signal processing apparatus comprising:
- substrate means for propagating acoustic waves at a surface thereof,
- a plurality of acoustic wave resonators disposed at said surface including:
- first resonator means comprising:
  - first and second reflector means,
  - input transducer means for launching a first surface standing wave therebetween, and
  - first distributed reflector means for diverting a portion of said first standing wave from said first resonator means,
- second resonator means comprising:
  - third and fourth reflector means,
  - output transducer means for abstracting a processed electrical signal from a second surface standing wave therebetween, and
  - second distributed reflector means responsive to said first distributed reflector means for generating said second surface standing wave, and
- fifth and sixth spaced apart reflector means respectively coupled to said first and second resonator means for forming third resonator means coupled thereto.

13. Signal processing apparatus comprising:
- substrate means for propagating acoustic waves at a surface thereof,
- first and second acoustic wave resonator means disposed at said surface, each including:
  - transducer means in energy exchanging relation with a respective surface wave,
  - first reflector means for confining each said respective surface wave within each said resonator means,
- second and third reflector means in mutual energy exchanging relation and respectively disposed within said first and second resonator means, and
- fourth reflector means cooperating with said second and third reflector means for forming third acoustic wave resonator means coupled to said first and second acoustic wave resonator means.

14. Apparatus as described in claim 13 further including:
- fifth and sixth reflector means in mutual energy exchanging relation,
  - said fifth reflector means being disposed in mutual energy exchanging relation with said second reflector means,
  - said sixth reflector means being disposed in mutual energy exchanging relation with said third reflector means, and
- seventh reflector means cooperating with said fifth and sixth reflector means for forming third acoustic wave resonator means.

15. Apparatus as described in claim 14 further including eighth reflector means cooperating with said second and fifth reflector means for forming fourth acoustic wave resonator means.

16. Apparatus as described in claim 15 further including ninth reflector means cooperating with said third and sixth reflector means for forming fifth acoustic wave resonator means.

* * * * *